(12) United States Patent
Ward et al.

(10) Patent No.: US 10,382,236 B2
(45) Date of Patent: *Aug. 13, 2019

(54) METHOD AND SYSTEM FOR CALIBRATING EQUALIZERS

(71) Applicant: INPHI CORPORATION, Santa Clara, CA (US)

(72) Inventors: Richard Ward, Campbell, CA (US); Parmanand Mishra, Cupertino, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/295,210

(22) Filed: Mar. 7, 2019

(65) Prior Publication Data

US 2019/0207788 A1 Jul. 4, 2019

Related U.S. Application Data

(63) Continuation of application No. 15/148,905, filed on May 6, 2016, now Pat. No. 10,270,628.

(51) Int. Cl.
*H04L 25/03* (2006.01)
*H04L 7/00* (2006.01)
*H04L 7/02* (2006.01)

(52) U.S. Cl.
CPC ...... *H04L 25/03885* (2013.01); *H04L 7/0016* (2013.01); *H04L 7/02* (2013.01)

(58) Field of Classification Search
CPC .... H04L 7/0016; H04L 7/02; H04L 25/03885
USPC ......................................................... 375/232
See application file for complete search history.

(56) References Cited

U.S. PATENT DOCUMENTS

| | | | |
|---|---|---|---|
| 6,483,882 B1* | 11/2002 | O'Dea | G11B 20/1426 375/340 |
| 6,507,308 B1* | 1/2003 | Ono | G01S 7/022 342/195 |
| 9,397,868 B1* | 7/2016 | Hossain | H04L 25/03057 |
| 2004/0158420 A1* | 8/2004 | Kim | H03L 7/0814 702/66 |
| 2010/0309791 A1* | 12/2010 | Fuller | H04L 1/20 370/242 |
| 2014/0281071 A1* | 9/2014 | Xu | G06F 13/42 710/105 |

* cited by examiner

*Primary Examiner* — Wednel Cadeau
(74) *Attorney, Agent, or Firm* — Richard T. Ogawa; Ogawa P.C.

(57) ABSTRACT

The present invention is directed to data communication. In a specific embodiment, a known data segment is received through a data communication link. The received data is equalized by an equalizer using an adjustable equalization parameter. The output of the equalizer is sampled, and a waveform is obtained by sweeping one or more sampler parameters. The waveform is evaluated by comparing it to the known data segment. Based on the quality of the waveform, equalizer parameter is determined. There are other embodiments as well.

20 Claims, 8 Drawing Sheets

METHOD AND SYSTEM FOR CALIBRATING EQUALIZERS

CROSS-REFERENCES TO RELATED APPLICATIONS

This application is a continuation of U.S. patent application Ser. No. 15/148,905, filed on May 6, 2016, which is hereby incorporated by reference in its entirety.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to data communication.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-data communication applications, serializer/deserializer (SERDES) and equalizers are used. For example, as a SerDes receives data, it performs equalization and data recovery.

Over the past, there have been many types of communication systems and methods. Unfortunately, they have been inadequate for various applications. More specifically, sense amplifiers are often inadequate. Therefore, improved systems and methods are desired.

BRIEF SUMMARY OF THE INVENTION

The present invention is directed to data communication. In a specific embodiment, a known data segment is received through a data communication link. The received data is equalized by an equalizer using an adjustable equalization parameter. The output of the equalizer is sampled, and a waveform is obtained by sweeping one or more sampler parameters. The waveform is evaluated by comparing it to the known data segment. Based on the quality of the waveform, equalizer parameter is determined. There are other embodiments as well.

According to an embodiment, the present invention provides a SerDes device, which has a terminal for receiving calibration data over a data communication link. The calibration data includes a predetermined data string. The device also includes an equalizer that is configured to process the calibration data using at least a first equalizer parameter and to output equalized data. The device further includes a sampler being configured to sample the equalized data and provide sampled data. The device additionally includes a detection module configured to determine relative position of the data samples. The device also includes a PLL module being configured to generate a clock signal associated with the calibration data. The device also includes a control module being configured to use n values as the first equalizer parameter and generate n waveforms using the sampled data corresponding to the n values of the first equalizer parameter. The control module is configured to evaluate the waveforms by comparing the waveforms to the predetermined data string.

According to another embodiment, the present invention provides a method for processing data received from a communication link. The method includes receiving modulated data based on a known data segment. The method also includes equalizing the modulated data segment using a first equalization parameter to get a first data. The method additionally includes sweeping the first data using a predetermined set of parameters by a sampler. The method further includes obtaining a first waveform from the sweeping the first data. The method also includes obtaining a second waveform sweeping a second data. The second data is associated with a second equalization parameter. The method additionally includes selecting an optimal equalization parameter based at least on comparing the first waveform and the second waveform to the known data segment. The method further includes equalizing a data stream using the optimal equalization parameter. The method also includes sampling the equalized data stream. The method includes generating a clock signal based on the equalized data stream.

According to yet another embodiment, the present invention provides a method for optimizing an equalizer. The method includes providing a data segment for calibration. The method also includes modulating the data segment. The method additionally includes transmitting the modulated data segment over a communication link. The method further includes receiving the modulated data segment. The method additionally includes equalizing the modulated data segment using a first equalization parameter to get a first data. The method further includes sweeping the first data using a predetermined set of parameters by a sampler. The method also includes obtaining a first waveform by the sweeping the first data. The method also includes obtaining a second waveform by sweeping a second data, which is associated with a second equalization parameter. The method also includes selecting an equalization parameter based at least on comparing the first waveform and the second waveform to the data segment.

It is to be appreciated that embodiments of the present invention provide many advantages over conventional techniques. Among other things, by directly capturing equalizer output as waveforms, equalizer performance can be efficiently evaluated. Based on the equalizer performance, optimal equalizer operating conditions can be used. In contrast, conventional techniques for evaluating equalizer performance typically involves eye scan, which are generally expensive processes. In addition, by capturing equalizer output as waveforms, random noise errors can be evaluated, which is an improvement over the 1-bit process used in conventional eye scan processes.

Embodiments of the present invention can be implemented in conjunction with existing systems and processes. For example, different types of existing equalizers can be evaluated according to embodiments of the present invention. The waveform capturing and evaluation process can be used in various types of SerDes and communication devices. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed to data communication. In a specific embodiment, a known data segment is received through a data communication link. The received data is equalized by an equalizer using an adjustable equalization parameter. The output of the equalizer is sampled, and a waveform is obtained by sweeping one or more sampler parameters. The waveform is evaluated by comparing it to the known data segment. Based on the quality of the waveform, equalizer parameter is determined. There are other embodiments as well.

As explained above, SerDes devices are commonly used in data communication systems and other applications. A typical SERDES receives the data, and on which it performs equalization and clock and data recovery. For example, the received data can be monitored on the receiver pins and rest is inside the chip. The performance of the data communication link is dependent on the equalization process that is internal to the device, and therefore monitoring the quality of the data after equalisation is important for debug and optimization. This is especially true in high-speed and low-margin data communication links.

Figure 1:
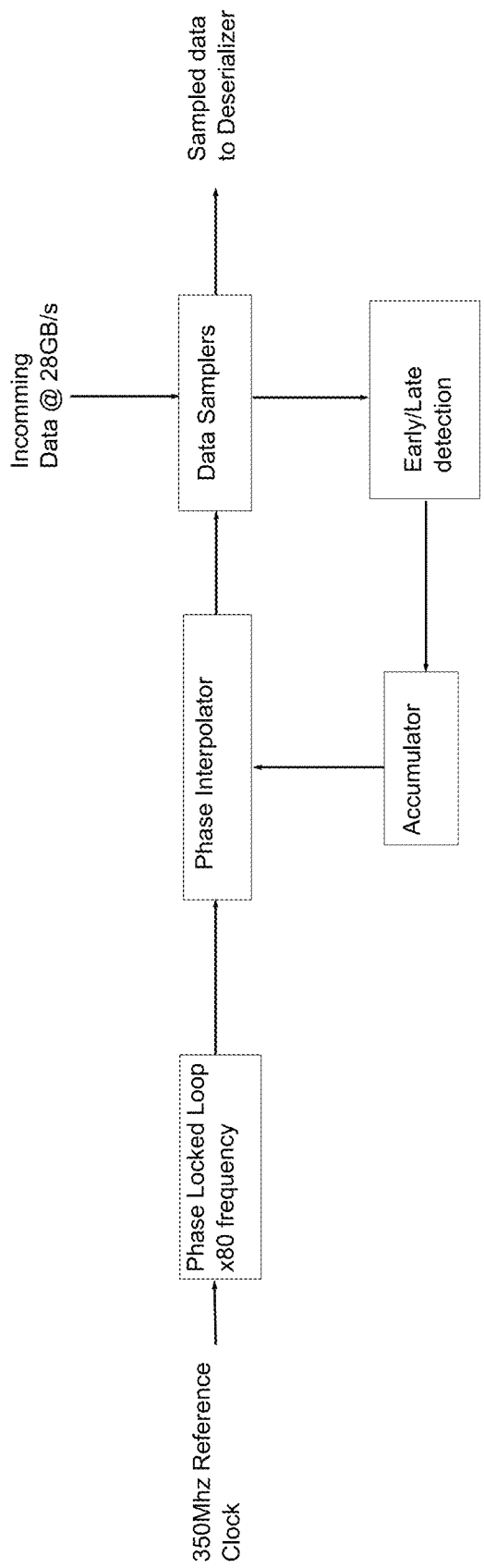
FIG. 1 is a simplified diagram illustrating a conventional SERDES receiver.

FIG. 1 is a simplified diagram illustrating a conventional SERDES receiver. As shown in FIG. 1, a reference clock provides a 350 Mhz reference frequency, which is multiplied by a phase-lock loop (PLL) to produce a clock at the required data rate (or a sub-multiple thereof for a time interleaved system). The clock signal is adjusted, in phase and frequency, by a phase interpolator to produce clock signals aligned to the center and edges of the incoming data. An early/late detection logic determines whether the clocks are sampling in the center of the eye, and adjusts the controls of the phase interpolator to get the required alignment. The external reference clock and the PLL can consume a relatively large amount of power for the SERDES receiver.

To monitor and optimize equalizer performance, various conventional techniques have been implemented. For example, eye scan technique has been used to monitor the performance after the equaliser, but it is limited to one-bit and does not provide detailed information on the channel losses a random pattern sees.

It is to be appreciated that embodiments of the present invention provide improved techniques for capture waveform, which includes a stream of bits, at equalizer output, and the captured waveform can be used in equalizer optimization, debugging, margin evaluation of communication links, and/or other applications.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 2:
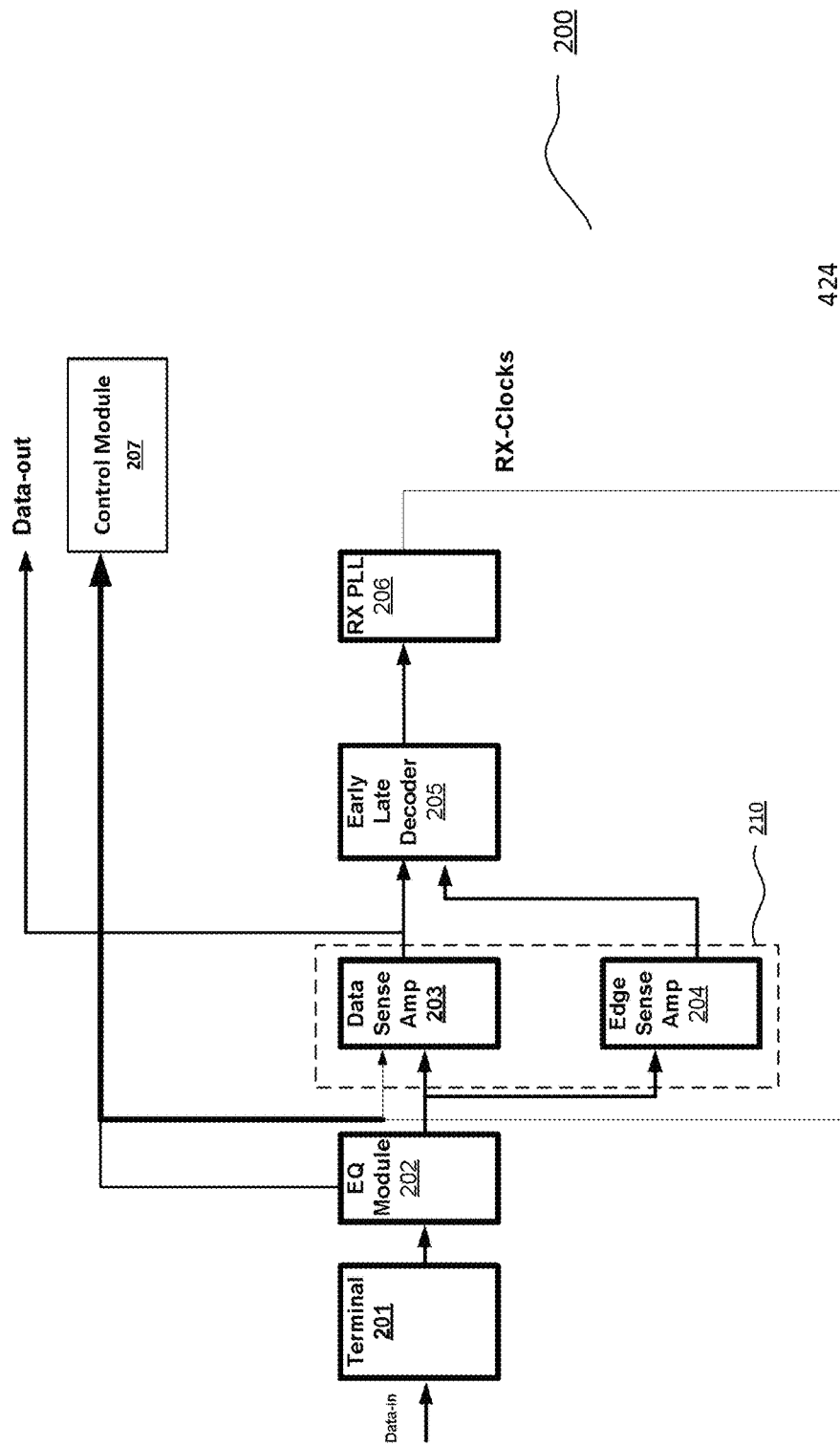
FIG. 2 is simplified diagram illustrating a SerDes input terminal according to an embodiment of the present invention.

FIG. 2 is simplified diagram illustrating a SerDes input terminal according to an embodiment of the present invention. This diagram is merely an example, which should not unduly limit the scope of the claims. One of ordinary skill in the art would recognize many variations, alternatives, and modifications. As shown in FIG. 2, received data (in the form of analog waveform) is received and processed by terminal 201. The equalizer module 202 performs equalization to remove distortion occurred during transmission through data communication link. As explained above, an important aspect of SerDes receiver is equalizer performance. As shown in FIG. 2, output of the equalizer module 202 is coupled to a control module. The equalizer module 202 can be implemented using various types of equalizers, such as continuous time linear equalizer (CTLE) and others. The equalizer module 202 performs equalization on analog data received through a data communication link, and the output of the equalizer module 202 is thus an analog data waveform that is captured and provided to the control module 207. In certain embodiments, the control module 207 includes an offset compensated sampler that is specifically implemented to capture output of the equalizer module for generating waveforms. Equalizer module 202 can be adjusted in various ways. For example, the equalizer module 202 receives control signals from the control module, and the control signals indicate the equalizer parameters to be used during the equalization process. As described below, output of the equalizer module 202 is sampled and captured into waveforms, which are then evaluated against calibration data. Based on the quality of the waveform, equalizer parameter is selected. The equalized analog data is provide to a sampler 210. For example, sampling typically involves two or more samplers. For example, the data sense amplifier 203 is used for data sampling, and edge sense amplifier 204 is configured for edge sampling. It is to be understood the data sense amplifier 203 and the edge sense amplifier 204 together amplify data received from the equalizer module 202. The output of the sampler 210 is provided as data out. Data sense amplifier 203 and the sense amplifier 204 are connected to decoder 205. Decoder, or sometimes referred to as "early/late detection module", is configured to determine whether the incoming data is early or late, which is typically measured in phase. For example, the decoder 205 comprises shift detection mechanisms for determining whether the incoming signal is sampled early or late. The decoder 205 is coupled to a phase-lock loop (PLL) module 206.

In various embodiments, the PLL module 206 is configured to provide clock signal recovery. In various embodiments, the PLL module 206 includes a charge pump, loop filter, voltage controlled oscillator, program delay, and/or other components. The output of the PLL module 205 comprises a recovered clock signal that is provided to data sense amplifier 203 and the edge sense amplifier 204 as shown.

It is to be appreciated that for the purpose of measuring and calibrating the equalizer module, control module 207 directly reads output of the equalizer module 202. For example, a compensated sampler is implemented as a part of the control module 207 or as a part of the equalizer calibration process. In contrast, conventional techniques for measuring equalizers involve using sampler output. For example, the data output from the sampler 201 is compared against an additional eye-scan sampler. The eye scan sampler has the capability to move the sampling point in X and Y and the comparator compares the output of the eye scan with the data sampler to map the eye at the output of the equaliser module. By directly measuring output of the equalizer module and use the equalizer data waveform, improved performance can be achieved.

Using the equalization calibration system according to embodiments of the present invention, output of the equalizer module is used during the equalization process. More specifically, a calibration process according to embodiments of the present invention involves sweeping the sampler threshold from low to high (or high to low), while recording the pattern captured and comparing with the intended pattern (e.g., predetermined data pattern specifically provided for calibration purpose). This operation is repeated while sweeping the voltage and/or phase offset parameters to map a complete waveform capture in horizontal and vertical axes. In various embodiments, the sampling sense amplifier comprises a comparator. For example, the sense amplifier circuit may include a voltage offset value that is capable of adjusting (e.g., increase or decrease) effective sampling threshold for calibration purpose. During the calibration process, a transmitter sends a data pattern to SerDes, which is received by the input terminal and equalized. The output of the equalizer, as a waveform, is captured and used for calibration. For example, if the sampler offset is set to its lowest value, the resulting received code will be all ones (the sample is always higher than the threshold set). On the other hand, if the sampler offset is set to its highest value, the resulting received code will be all zeros (the sample is always lower than the threshold set). The system inverts the data received from the sampler due to the above effect. "All zeroes" and "all ones" as sampled data are boundary conditions or worst case scenarios, where the incoming data as sampled become meaningless. In various embodiments, different sampler offset values are tried, and the sampler offset value that is associated with the highest rate of sampled data matching the predetermined known calibration pattern is the optimal offset value that should be used in operation. For example, after vertical and horizontal sweeps are completed, the dataset includes relevant information to decode the waveform of the system.

Figure 3:
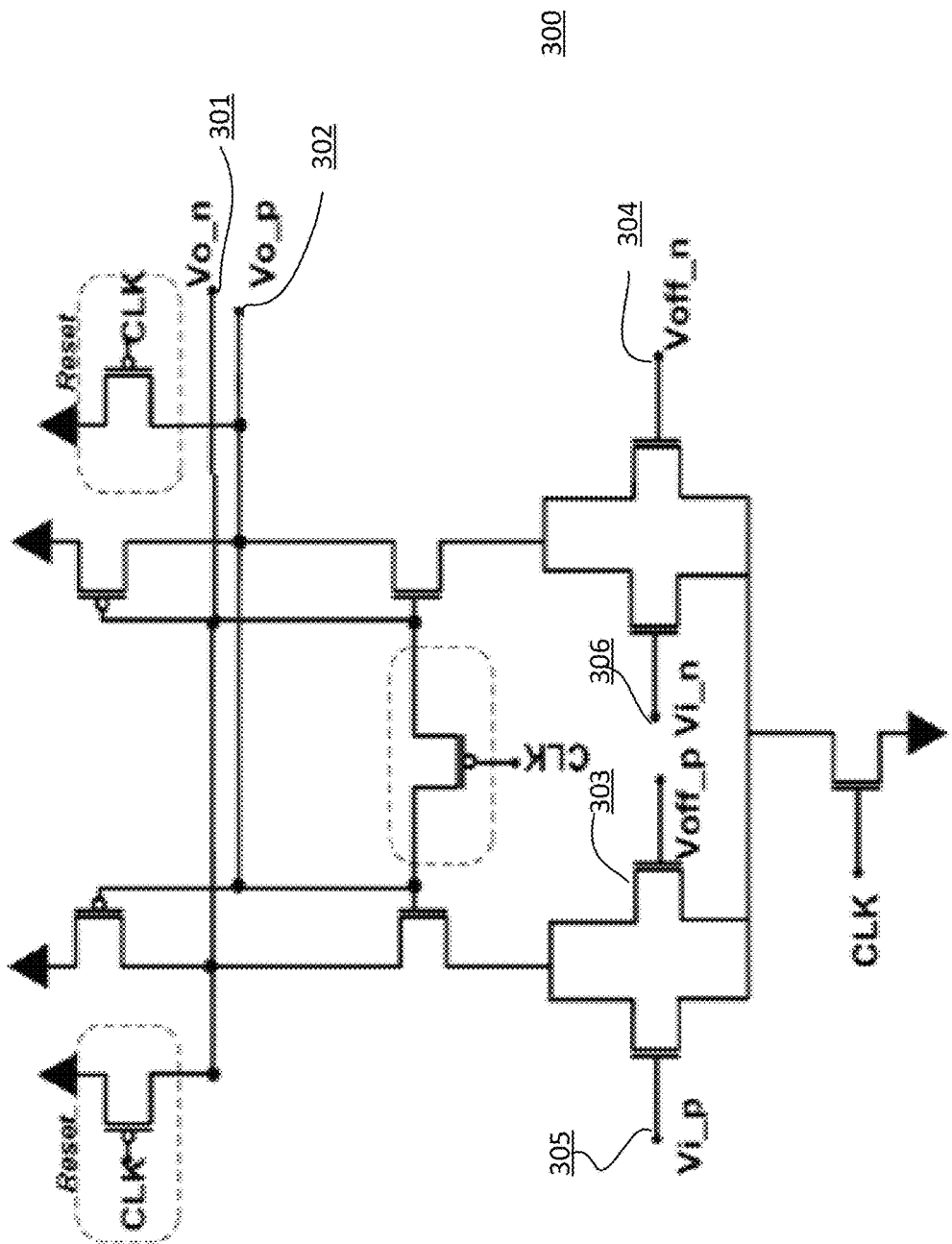
FIG. 3 is a simplified diagram illustrating an offset compensated sampler according to an embodiment of the present invention.

FIG. 3 is a simplified diagram illustrating an offset compensated sampler according to an embodiment of the present invention. This diagram is merely an example, which should not unduly limit the scope of the claims. One of ordinary skill in the art would recognize many variations, alternatives, and modifications. As shown in FIG. 3, an offset compensated sampler includes terminals 303 and 304 for applying offset voltages. Depending on the sampler design, sample circuits often have undesirable threshold voltage mismatch. To compensate for device threshold voltage ($v_t$) mismatch, offset voltages are applied in parallel to the main sampler devices. For example, terminal 303 receives positive voltage offset $v_{off\_p}$ and terminal 304 receives negative voltage offset $v_{off\_n}$. Terminal 305 ($v_{i\_p}$) and terminal 306 ($v_{i\_n}$) provide sampler device controls (e.g., data stream). As an example, the offset compensated sampler sweeps through sampler.

Figure 4:
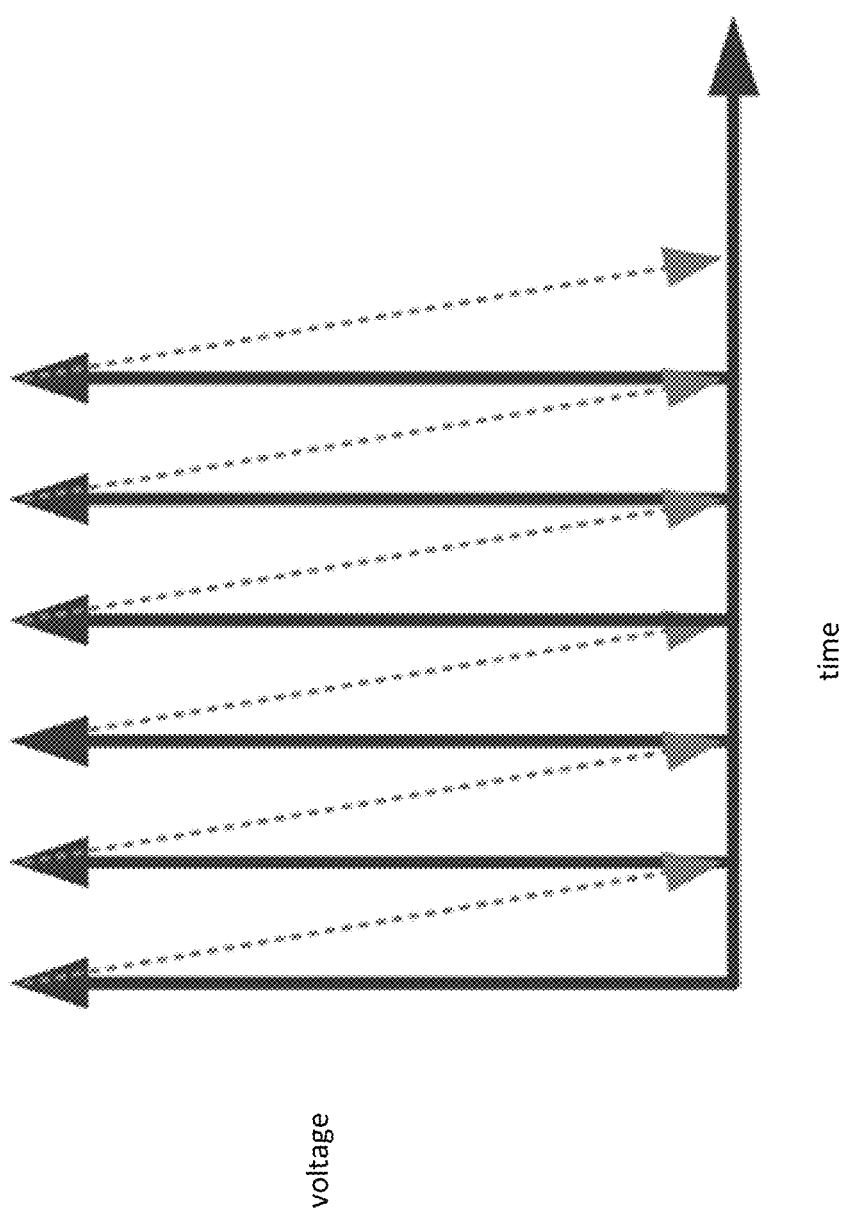
FIG. 4 is a sampling diagram illustrating a processing for scanning waveform according to an embodiment of the present invention.

FIG. 4 is a sampling diagram illustrating a processing for scanning waveform according to an embodiment of the present invention. Depending on the specific implementation, a waveform can be scanned in various ways. As shown in FIG. 4, voltage (vertical) is scanned is scanned first, and then time (horizontal) is scanned. It is to be appreciated that other parameters can be swept to generate the waveform as needed.

Figure 5:
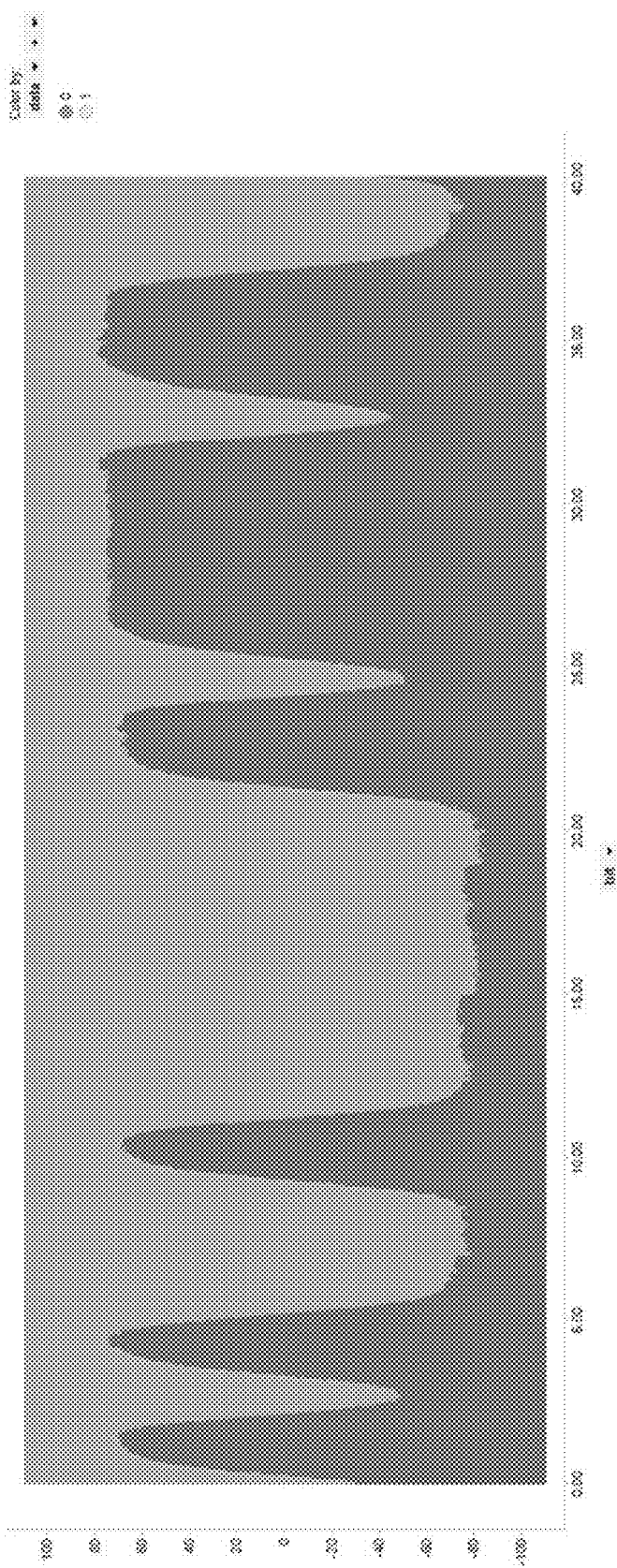
FIG. 5 is a simplified diagram illustrating a captured waveform according to an embodiment of the present invention.

FIG. 5 is a simplified diagram illustrating a captured waveform according to an embodiment of the present invention. More specifically, a fixed 40-bit pattern (zeroes and ones in digital form) is transmitted over a communication link as an analog data waveform. The received data waveform is recovered and equalized. For sampler offset is swept from −200 to 200 code values (representing a defined mV step each). The phase of the sampler is swept inside the unit interval of the bit (e.g., 128 steps in here for the purpose of illustration). For example, transitions between "0" and "1" at each phase step represents an accurate captured waveform of the system.

Figure 6:
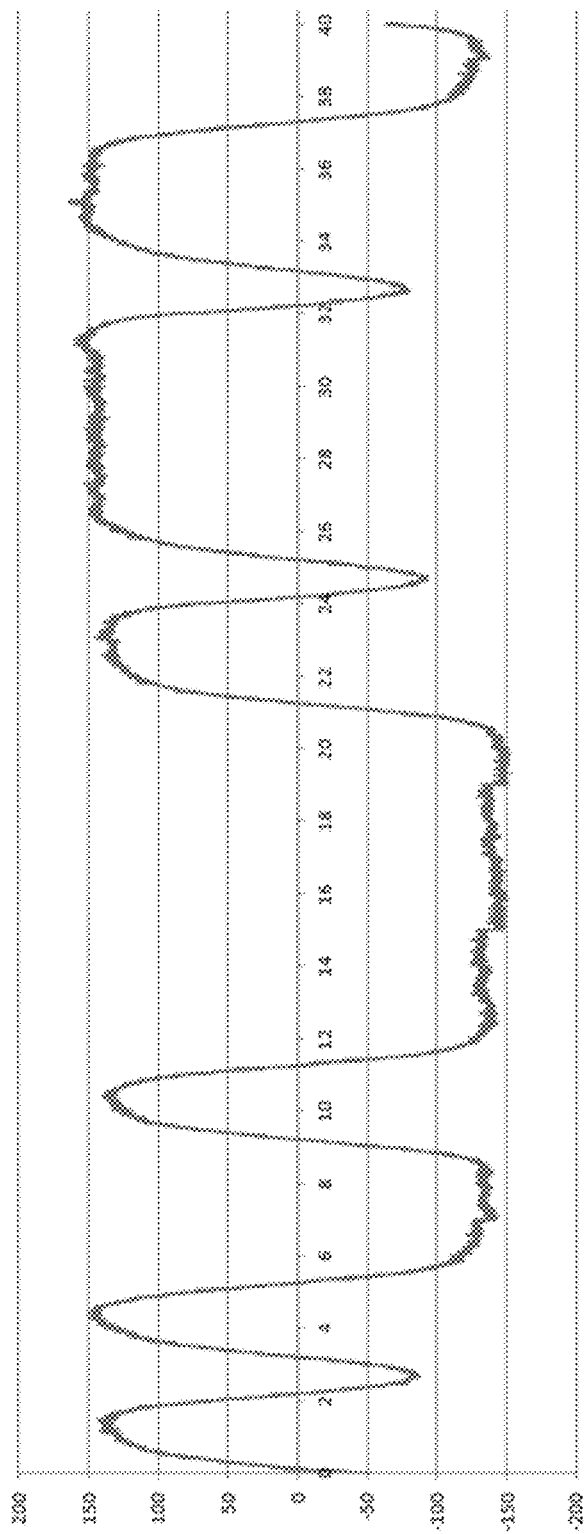
FIG. 6 is a simplified diagram illustrating an output of a 25 Gbps waveform.
Figure 7:
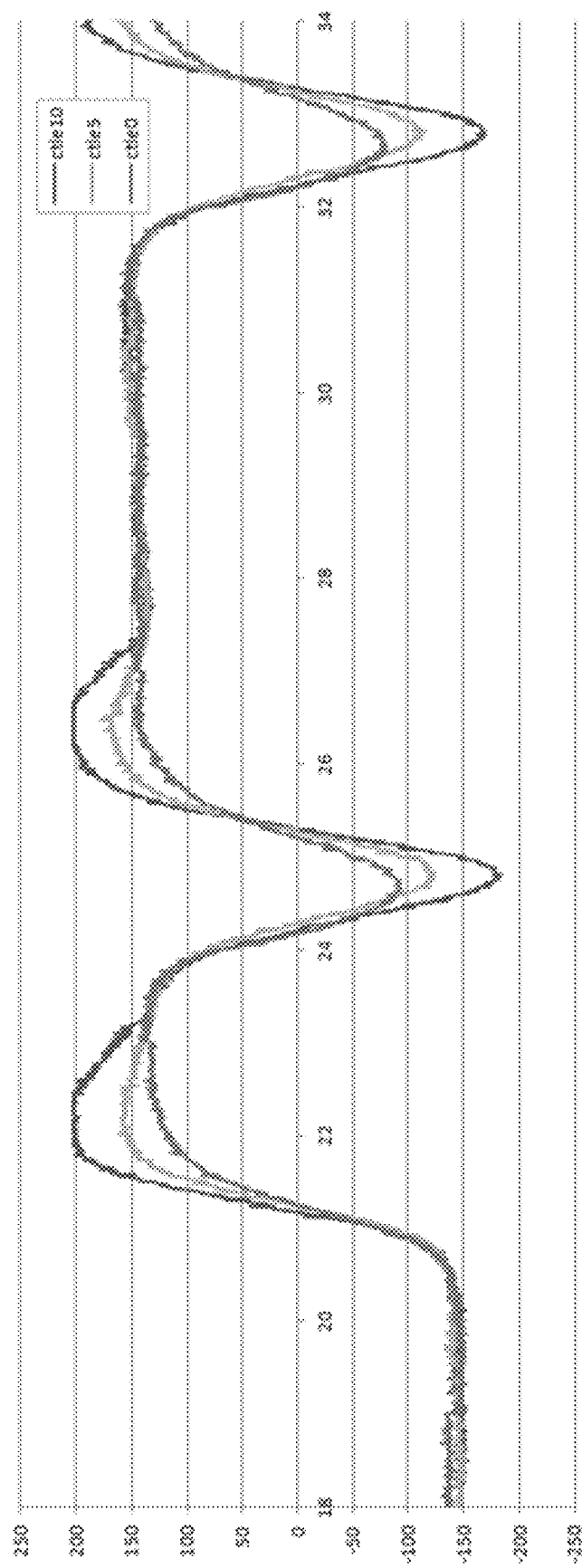
FIG. 7 is a graph illustrating equalizer output waveforms at different parametric settings according to embodiments of the present invention.

FIG. 6 is a simplified diagram illustrating an output of a 25 Gbps waveform. This type of waveform, as implemented according to embodiments of the present invention, can be used to calibrate equalizer module. For example, for the same calibration pattern (e.g., a 40-bit data stream), different equalizer parameters are used (like high frequency boost) and the equalizer parameter that is associated with the best waveform is used as the calibrated equalizer parameter. For example, the best waveform is the captured waveform (at output of the equalizer module) that matches most closely to the calibration pattern. FIG. 7 is a graph illustrating equalizer output waveforms at different parametric settings according to embodiments of the present invention. For example, "ctle10", "ctle5", and "ctle10" are different settings of a continuous-time linear equalizer, and it is to be understood that other types of equalizers can be calibrated as well.

Figure 8:
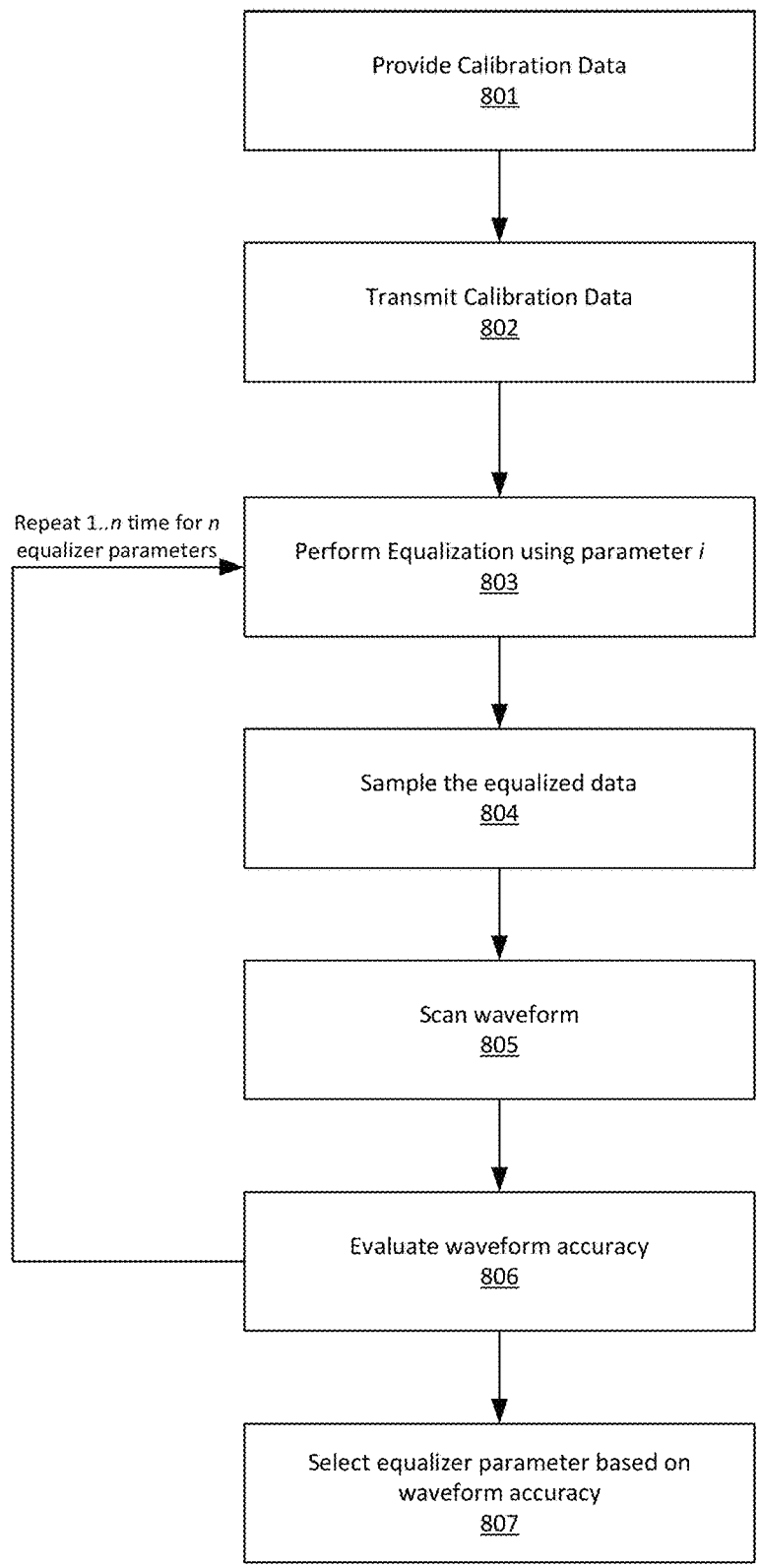
FIG. 8 is a simplified flow diagram illustrating a process for calibrating an equalizer according to an embodiment of the present invention.

FIG. 8 is a simplified flow diagram illustrating a process for calibrating an equalizer according to an embodiment of the present invention. This diagram is merely an example, which should not unduly limit the scope of the claims. One of ordinary skill in the art would recognize many variations, alternatives, and modifications. For example, one or more steps may be added, removed, repeated, replaced, modified, rearranged, and/or overlapped, which should not limit the scope of the claims. As an example, process 800 illustrated in FIG. 8 can be performed by system 200 illustrated in FIG. 2. Depending on the implementation, offset compensated samplers may be used to perform sampling processes described below.

Process 800 starts with step 801, wherein the calibration data is provided. For example, a predetermined 40-bit known data stream is provided. Depending on the implementation, the 40-bit data stream may be specifically selected to provide transitions between "0" and "1" to allow measurement and evaluation of the equalized data waveform. The length of the data stream may be different (e.g., 80-bit, 128-bit, etc.). For example, a large calibration data can potentially provide better accuracy than a small one, but typically at a cost of higher calibration time and resources. As explained above, since a data string (as opposed to 1 bit data) is used to calibrate the equalizer, it is possible to evaluate various performance metrics of the equalizer, including random noises that are often difficult to detect with 1-bit detection systems.

The calibration data is available to both transmitter and receiver. The waveform that is later to be captured is only useful after being transmitted through a data communication link. The receiver needs to calibration data for comparison and evaluation of the captured waveform. In various embodiments, the calibration data is standardized in communication systems, thereby allowing equalizer calibration to be performed among different components and/or entities. For example, a transceiver may be both transmitting and receiving, and the calibration data can be used to calibrate the equalizer at the receiving end.

At step 802, the calibration data is transmitted by the transmitter. For example, a 40-bit calibration data stream is in digital form and comprises "0" and "1". For the transmission, the calibration data is modulated by the transmitter, and the calibration data in analog form after modulation is transmitted from the transmitter to the receiver via a data communication link. For example, the data communication may be a data bus (e.g., from static memory to DRAM, etc.), optical communication link, and/or other types of communication links. The calibration data, in analog form, is received by an input terminal of the receiver. For example, terminal 201 in FIG. 2 is an input terminal for receiving analog data signal from a data communication link. For example, various undesirable characteristics can be attributed to data communication link as data degrade through a transmission medium, and random noises may be introduced.

At step 803, equalization is performed on the captured data. Using system 200 as an example, equalization is performed by equalizer module 202. For the purpose of equalizer calibration, equalizer parameter i is used during the equalization process. For example, a total number n parameters are to be used in separate equalization and waveform capture processes for the same calibration data received from the transmitter. Equalizer parameter, depending on the implementation, may be bias voltage, phase offset, voltage offset, and/or other equalizer settings. For example, equalizer parameter may be specific to the type of equalizer used (e.g., CTLE, etc.). In various embodiments, the equalization parameter may include more than a single parameter. For example, two or more equalization parameters may be used to adjust performance characteristics of the equalizer.

At step 804, equalizer output is sampled for waveform capture. As explained above, an offset compensated sampler is used during sampling process. In a specific embodiment, the offset compensated sampler illustrated in FIG. 3 is used. For exampling, during the sampling processes, different offset voltages (e.g., positive and negative compensation voltages) may be used to compensate threshold voltage mismatch. In certain embodiments, the sampler is configured to sweep offset from a range of code values (e.g., from −200 to +200, representing predefined units in millivolts steps for each of the codes). Other types of samplers may be used as well. For example, as shown in FIG. 2, data and edge sense amplifier may be used for performing the sampling process. For example, data and edge sense amplifier are used to capture raising and falling edges of data. For the purpose of sweeping through offset voltages, offset compensated samplers may be used. For example, offset voltages may be a single voltage or a pair or offset voltages described above. As mentioned above, a sampling sense amplifier that includes a comparator may be used for performing the sampling sweep. For example, the sampling sense amplifier sweeps through a voltage offset value that increases or decreases the effective sampling threshold.

At step 805, the sampled waveform is scanned. Depending on the application, the scanning of sampled data can be performed in various ways. According to an embodiment, the sampler threshold is swept from low to high. For example, the scanning may include voltage sweep, time sweep (as shown in FIG. 4), sampler offset sweep, and/or sampler phase sweep (as shown in FIG. 5). After scanning, a scanned waveform is obtained. As an example, for time and voltage scanning, a waveform as shown in FIG. 4 is obtained; using sampler offset (in code values) and phase offset (in unit interval of bits), a waveform as shown in FIG. 5 is obtained.

At step 806, waveform is evaluated for accuracy. For example, FIG. 5 illustrates that transitions between 0 and 1 at each phase step represent accurate captured waveform of the system. The quality of the waveform can be evaluated based on the number of transitions that match the initial data that was transmitted. For example, a 40-bit data string may be provided as the calibration data, and the goal is to have the waveform captured at the receiving end to match the calibration data as much as possible. For the purpose of selecting the best equalizer parameter for data transmission, different equalizer settings are tried. As shown in FIG. 8, after waveform accuracy for a particular equalizer parameter is evaluated, the processes goes to back step 803, where a different equalizer setting is used. Steps 803 to 806 repeat n times so that n equalizer parameters are used in waveform capturing process.

At step 807, an equalizer parameter is selected based on the waveform accuracy. More specifically, for each of the n equalization parameters that have been used in equalizing received signals, a corresponding waveform is scanned and evaluated. The equalization parameter associated with the most accurate waveform, as evaluated and determined at step 806, is selected. For example, as shown in FIG. 7, three waveforms associated with three different equalization parameters are shown. Depending on these waveforms compared to the calibration data, the waveform with the closest match to the calibration data is selected. For example, if the waveform associated with "ctle5" parameter is determined to be the closest match to the calibration data, the "ctle5" parameter is selected as the equalization parameter that is to be used in operating the equalizer.

While the above is a full description of the specific embodiments, various modifications, alternative constructions and equivalents may be used. Therefore, the above description and illustrations should not be taken as limiting the scope of the present invention, which is defined by the appended claims.

What is claimed is:

1. A receiver device comprising:
a terminal for receiving calibration data over a data communication link, the calibration data being a predetermined data string;
an equalizer configured to process the calibration data using at least a first equalizer parameter and to output equalized data;
a sampler configured to sample the equalized data and provide sampled data;
a PLL module configured to provide the recovered clock signal to the sampler;
a control module directly coupled to the equalizer and configured to directly reads output of the equalizer module, the control module being configured to use n values as the first equalizer parameter and generate n waveforms by sweeping a sampler threshold and using the sampled data corresponding to the n values of the first equalizer parameter, the control module further being configured to evaluate the waveforms by comparing the waveforms to the predetermined data string based on a matching number of transitions; and
an output terminal being coupled to the sampler and providing the sampled data.

2. The device of claim 1 wherein the calibration data are associated with a known m-bit data string modulated by a transmitter.

3. The device of claim 1 wherein the control module is further configured to select an equalizer parameter based on the evaluation of the waveforms.

4. The device of claim 1 wherein the sampler comprises a comparator.

5. The device of claim 1 wherein the sampler is configured to use different voltage offset values, the control module being configured to change the voltage offset values used by the sampler.

6. The device of claim 1 wherein the sampler comprises an offset compensated sampler.

7. The device of claim 1 wherein the sampler comprises a data sense amplifier and an edge sense amplifier.

8. The device of claim 1 wherein the equalizer comprises a continuous-time linear equalizer.

9. A receiver device comprising:
a terminal for receiving calibration data over a data communication link, the calibration data being a predetermined data string;
an equalizer configured to process the calibration data using at least a first equalizer parameter and to output equalized data;
a sampler configured to sample the equalized data and provide sampled data, the sampler comprising an edge sense amplifier and a data sense amplifier;
a PLL module configured to provide the recovered clock signal to the sampler; and
a control module directly coupled to the equalizer and configured to directly reads output of the equalizer module, the control module being configured to use n values as the first equalizer parameter and generate n waveforms by sweeping a sampler threshold and using the sampled data corresponding to the n values of the first equalizer parameter, the control module further being configured to evaluate the waveforms by comparing the waveforms to the predetermined data string based on a matching number of transitions.

10. The device of claim 9 wherein the sampler is an offset compensated sampler.

11. The device of claim 9 further comprising an early late decoder.

12. The device of claim 9 further wherein the PLL includes a charge pump.

13. The device of claim 9 wherein the sampled data are coupled to a data output terminal.

14. The device of claim 9 wherein the edge sense amplifier provides edge sampling.

15. The device of claim 9 wherein the data sense amplifier provides data sampling.

16. The device of claim 11 wherein the early late decoder comprises shift detection mechanisms.

17. A method for processing data received from a communication link, the method comprising:
equalizing a known data segment using a first equalization parameter to get a first data by an equalizer;
sweeping the first data using a predetermined set of parameters by a sampler;
obtaining a first waveform from the sweeping the first data by directly reading output of the equalizer;
obtaining a second waveform sweeping a second data by directly reading the output the equalizer, the second data being associated with a second equalization parameter;
selecting an optimal equalization parameter based at least on comparing the first waveform and the second waveform to the known data segment string based on a matching number of transitions;
equalizing a data stream using the optimal equalization parameter;
generating an output data stream by sampling the equalized data stream; and
outputting the output data stream.

18. The method of claim 17 wherein the optimal equalizer parameter comprises an offset voltage value.

19. The method of claim 17 wherein the optimal equalizer parameter comprises a phase offset value.

20. The method of claim 18 wherein the offset voltage value correspond to a code value.

* * * * *